United States Patent [19]

Bergmann et al.

[11] 4,275,126
[45] Jun. 23, 1981

[54] FUEL CELL ELECTRODE ON SOLID ELECTROLYTE SUBSTRATE

[75] Inventors: Erich Bergmann, Bienne, Switzerland; Gerard Horlaville, LaMotte-Cernex, France

[73] Assignee: Battelle Memorial Institute, Geneva, Switzerland

[21] Appl. No.: 29,158

[22] Filed: Apr. 11, 1979

[30] Foreign Application Priority Data

Apr. 12, 1978 [CH] Switzerland .................... 3903/78
Feb. 22, 1979 [CH] Switzerland .................... 1770/79

[51] Int. Cl.³ .................................................. H01M 8/10
[52] U.S. Cl. ................................... 429/30; 429/41; 204/192 C
[58] Field of Search ................... 429/40–45, 429/30; 204/192 C, 192 SP

[56] References Cited

U.S. PATENT DOCUMENTS

| | | | |
|---|---|---|---|
| 3,377,203 | 4/1968 | Möbines et al. | 429/40 X |
| 3,410,728 | 11/1968 | Fullman et al. | 429/40 X |
| 3,479,276 | 11/1969 | Jung et al. | 429/40 |
| 3,573,993 | 4/1971 | Pabst et al. | 429/40 X |
| 3,684,578 | 8/1972 | Makishima et al. | 429/40 X |
| 4,001,039 | 1/1977 | Elmore et al. | 429/40 X |
| 4,031,291 | 6/1977 | Fullemoider | 429/40 |
| 4,107,018 | 8/1978 | Bode et al. | 204/192 SP |
| 4,125,676 | 11/1978 | Mauile et al. | 429/40 X |

Primary Examiner—Charles F. LeFevour
Attorney, Agent, or Firm—Karl F. Ross

[57] ABSTRACT

The invention concerns a process for manufacturing electrodes for fuel cells operating at elevated temperatures, said process consisting in depositing by cathodic sputtering on a solid electrolyte substrate active mixtures of oxides and metals. The control of the relative rates of deposition of the various constituents of these active compositions is achieved by regulating individually independent magnetic fields acting on each of the components subjected to sputtering. A very high degree of homogeneity within the layers and of reproducibility of the compositions of the mixtures is achieved in this manner.

7 Claims, 7 Drawing Figures

FUEL CELL ELECTRODE ON SOLID ELECTROLYTE SUBSTRATE

FIELD OF THE INVENTION

The present invention relates to a process for manufacturing electrodes for reversible fuel cells, an apparatus for performing this process and the electrodes resulting from this manufacturing process.

BACKGROUND OF THE INVENTION

The term "reversible fuel cell" denotes a device capable of operating both to generate current from the reaction between a fuel and an oxidant and to electrolyze the combustion products.

The electrodes concerned in the present invention, are for use in devices operating at elevated temperatures, in particular within the range 600° to 1000° C., to generate an electric current from gaseous fuels and oxidants or, inversely, to dissociate electrolytically into their components the products resulting from the combustion of such fuels. These electrodes are made of porous ceramic materials capable of conducting electrons and ions and, by reasong of their porosity, they are permeable to gases. These gases are either reactive gases or reaction products. As examples of such gases there may be mentioned $H_2$, $CO$, $NH_3$, $CH_4$ and other hydrocarbons, $H_2O$, $O_2$, $N_2$ and air. When the device operates as a generator the anode is the negative electrode to which the combustible gases migrate and the cathode is the positive electrode where the oxidant gases are reduced by electrons which have passed through the external electrical circuit. In the electrolytic mode, the polarities are the same, but the designation of the electrodes (cathode and anode) is inverted.

In fuel cells, the electrodes are separated by a solid electrolyte which is impermeable to gases, and is referred to subsequently as the substrate. The latter, which must provide for the migration of the $O^{2-}$ ions produced at the positive electrode in the direction of the negative electrode where they are discharged, is usually composed of metal oxides, examples of which have been described in Swiss Patent Specification CH 594 292.

The component materials of the electrodes, detailed examples of which have also been disclosed in Swiss Patent Specification CH 594 292, generally comprise solid porous mixtures of metal and metal oxide powders in the form of agglomerated fine particles (cermets). By way of examples of such metal powders there may be mentioned powders of Ni, Co, Cu, Ag, Au and Pt. As examples of metal oxides there may be mentioned thoria, hafnia and zirconia, stabilized in the cubic phase by oxides such as MgO, CaO, $Y_2O_3$ and the rare earth oxides. Mention may also be made of oxides employed by reason of their good electronic conductivity, for example the oxides of Sn, In and Bi. Moreover, in order to improve the electronic conductivity of stabilized zirconia the latter may be doped with metal oxides, notably with uranium and cerium oxides for the electrodes in contact with the fuel (anodes in battery mode and cathodes in electrolyzer mode) and the oxides of uranium and of praseodymium for the electrodes in contact with the oxidant ($O_2$).

The materials constituting the electrodes may also contain other components intended to improve their mechanical strength and, more particularly, to ensure their compatibility with the solid electrolyte with which they are associated, notably from the point of view of expansion in the course of temperature variations.

The foregoing indications relating to the composition of the electrodes are given purely by way of illustration, because, generally, the invention does not relate to the choice of the materials used in the electrodes but, in spite of an exception referred to later, more specifically to their nature and their structure which derive essentially from the manufacturing process.

In particular, these electrodes were hitherto manufactured by various processes among which there may be mentioned spraying onto the substrate of particles of the electrode constituents by mechanical means or in a blowpipe-flame or plasma, vapor-phase deposition (C.V.D.), and high-vacuum evaporation-condensation.

However, all these processes suffer from drawbacks generally linked with the extreme conditions (high temperatures, deformations, etc. . . . ) which prevail during their use. Thus they usually lead to deposits of irregular shape and thickness, and compositions which are difficult to reproduce. Moreover, the versatility of these processes is low, and they lend themselves poorly, if at all, to the deposition of well-controlled, variable-composition electrode layers for modern fuel cells.

SUMMARY OF THE INVENTION

These drawbacks are remedied by the process according to the invention. The latter involves essentially the cathodic disintegration (cathode sputtering) technique, with control of the degree of sputtering by magnetic field (magnetic enclosure). It is characterized in that within an airtight enclosure containing an anode and a cathode, a solid electrolyte substate is disposed and, facing it, a cathode support comprising at least two target regions, each coated with at least one ingredient to be sputtered constituting a target, the cathode space of each of these being individually subjected to an independent magnetic field of adjustable intensity, the air contained in the enclosure is evacuated and inert or reactive gas is introduced under reduced pressure, there is established an anode-cathode potential of sufficient strength to produce a glow discharge in the gas and to bring about the sputtering of the targets as well as deposition of material on the substrate, and there is effected an individual setting of the intensity of the magnetic field of each target region so as to control the relative sputtering rates of the targets to achieve on the substrate a deposit of predetermined composition as a function of the aforesaid rates of sputtering.

The cathode space is to be understood as being that region of space which is located in proximity to the target and in which the phenomena (glow discharge) occur which lead to the production of particles which, by their impact on the target, bring about the sputtering effect.

Thus, as indicated in the foregoing, the process of the invention makes it possible to effect the simultaneous or successive sputtering of several different substances, at rates which may vary with time according to a selected function, and in a manner completely independent of each other.

It is to be noted that there already exist processes and devices for cathodic sputtering for effecting the coating of substrates with substances which are sputtered either simultaneously or successively. Thus, French Pat. No. 1 459 893 describes an apparatus for cathodic sputtering, in which the ion (plasma) generating discharge region is placed, within the sputtering enclosure, under the control of a fixed magnetic field. Moreover this device has a plurality of cathodes each comprising a different substance to be sputtered, these cathodes being displaceable relative to the region where sputtering takes place, and the voltage required for the latter is applied successively to each of these cathodes. It therefore does not seem possible, with such a device having only one magnetic field, to exert an individual control on the sputtering rate of each of the available substances and to obtain according to the substrate homogeneous deposits the composition of which can be varied at will.

Similarly, French Patent Application No. 2 358 020 describes a cathodic sputtering device having a magnetic field in which the magnets generating this field (permanent or electromagnets) can move relative to the cathode. The region of flow discharge associated with said magnetic field can thus sweep successively each point of the target to be sputtered, which makes it possible to render its erosion more uniform. Moreover, according to one form of embodiment of this device, the target comprises two different substances to be sputtered and, by displacing the magnetic assembly relative to this target, it is possible to bring about the sputtering of either the first substance or of the second substance or, in an intermediate position, of both. However, with this device, the sputtering rate of one of these substances can only be increased at the expense of the sputtering rate of the other substance, which in consequence allows simultaneous action on two substances only. In contrast, in the present invention, the different sputtering rates can be controlled individually and completely independently from each other which, particularly in the case where the number of substances to be sputtered is greater than two, offers a much greater range of possibilities and provides coatings with 3, 4 or 5 (or even more) components, the proportions of each of which within the mixture can vary, with thickness, in any arbitrary manner.

Mention will also be made of the existance of a cathodic sputtering process with a magnetron (U.S. Pat. No. 3 956 093), in which there is employed an apparatus comprising, in addition to the permanent magnets providing a magnetic field in the interior of which the glow discharge region is formed, an electromagnet through which an alternating current flows, the field of which is perpendicular to that of the permanent magnets. In consequence, the culminating region of sputtering, which corresponds to those regions of space in which the resultant of the fields of force is parallel to the target, will move relative to the latter according to the variations of said alternating field, so as to sweep with time the whole of the surface to be sputtered, which results in an improvement in the uniformity of target erosion. However, this reference does not mention the possibility of acting simultaneously or successively on several distinct targets.

Finally, it will be noted that the manufacture of generator electrodes is not novel in itself; such manufacture has been indicated or suggested in the following publications: French Pat. Nos. 1 454 165; 1 008,427; paper by R. J. BROOK et al.; J. Electrochem. Soc. 118 (2), 185–92 (1971).

In the present invention, the components to be sputtered which have been deposited on the target regions of the cathodic support can be selected from among the metal powders and the various oxides referred to hereinbefore. These substances could be selected either as individual compounds or as already prepared mixtures without having to worry about the more or less great volatility of the diverse components, since the temperature to which the materials to be sputtered are subjected does not exceed approximately 100° C., and the constraints imposed by the evaporation methods cease to apply. Thus, by way of an example, the deposition of stabilized zirconia by conventional means involved, prior to evaporation, a stabilizing sintering step, complicated and uneconomical, which is not the case with the present process.

The present process also offers the considerable advantage that it allows the introduction into the deposited material of a certain controlled degree of porosity. To this effect, it is possible to sputter simultaneously with the electrode constituents, substances removable from the active material of the electrode, whereby appropriately ordered voids give to the latter the desired porosity. As such substances there may be employed solids which are sufficiently volatile to evaporate or to sublimate at temperatures somewhat lower than the operating temperatures of the electrode. As examples of such substances there may be mentioned, to cite but a few, KCl, Sb, Zn, Pb, etc. . . .

In order to render the active material porous, it is also possible to subject the electrode, freshly prepared by coating of a substrate with a deposit of sputtered material, to an appropriate thermal treatment to bring about, within the deposited material, a physical and/or chemical modification. For example, the electrode can be heated in a reducing hydrogen or CO atmosphere so as to reduce, at least partly, the metal oxides contained in said material, this reduction leading to the creation of interstitial voids and a porous structure. As oxides suitable for such a reducing process there can be employed oxides of Ni, Co, Cu, etc. . . .

It has been stated previously that the sputtering is carried out in the presence of an inert or reactive gas. In the case where an inert gas is used, the sputtered substances are not modified during the deposition (unless, of course, they react with each other on the substrate). In the presence of a reactive gas, for example $O_2$, $N_2$, or acetylene, it is possible to obtain directly from the target metals the corresponding oxides, nitrides, or carbides.

BRIEF DESCRIPTION OF THE DRAWING

The attached drawing illustrates schematically an embodiment of the apparatus for performing the invention and, examples in which electrodes manufactured according to the invention are used in a reversible fuel cell/water electrolysis device. In the drawing

SPECIFIC DESCRIPTION AND EXAMPLES

Figure 1:
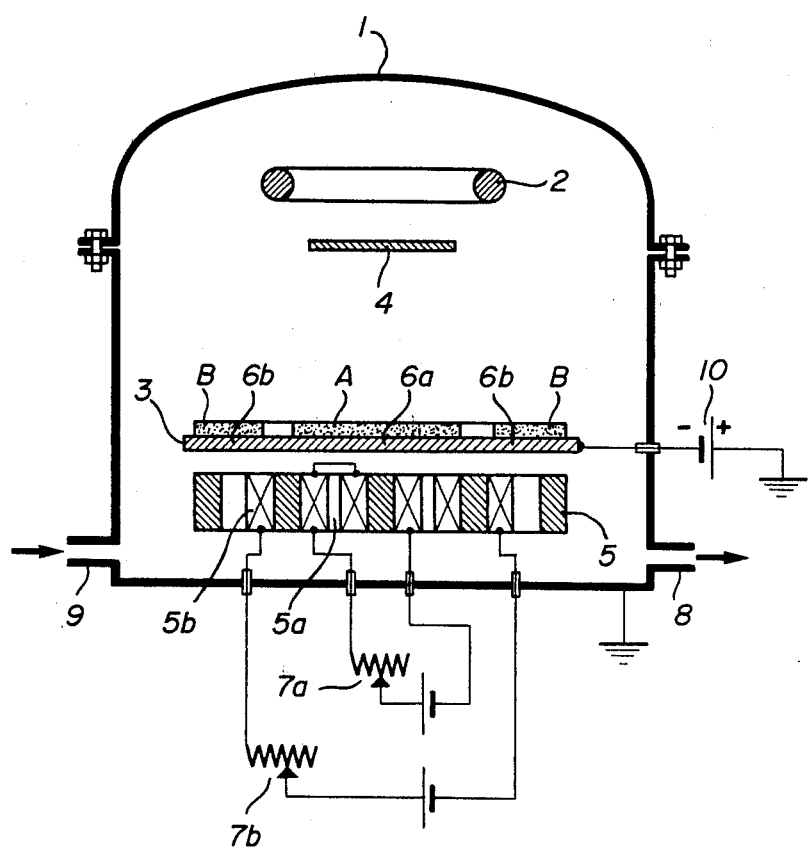
FIG. 1 shows schematically an axial vertical section of a cathodic sputtering enclosure with magnetron control.

The apparatus according to the invention comprises (see FIG. 1) a vacuum chamber 1, an anode 2, a cathode 3, a substrate 4 on which the deposition by sputtering is effected and a set of variable electromagnets 5 located close to the cathode 3. The surface of this cathode has target regions 6 coated with the substances to be sputtered which constitute the targets proper, the cathode space of the target regions being located so as to be swept by the field of one of the electromagnets 5a or 5b.

These target regions may be circular 6a, or annular 6b and concentric with 6a, the corresponding electromagnets having a central coil 5a with two coaxial windings, and a coil 5b coaxial with the first two windings and surrounding these. These coils are connected by the rheostats 7a and 7b to respective power sources. The operation of this apparatus is as follows:

After introducing the substrate 4 into the chamber 1, the air contained in the latter is evacuated through the conduit 8 by means of a pump(not shown)and an inert gas, for example argon, is introduced through the conduit 9 until a predetermined fixed pressure of between $10^{-2}$ and $10^{-4}$ Torr is reached. Following this, a d.c. potential of the order of 300 to 1000 volts is applied to the cathode by means of a source 10. Finally, the rate of sputtering is adjusted by means of the rheostats 7a and 7b which control the electromagnets in order to ensure that the components of targets 6a and 6b are deposited at a predetermined rate on the substrate to produce there a coating of precisely determined composition. When working with high-intensity magnetic fields, it will be advantageous to provide for an efficient cooling of the coils and of the cathode, in particular by arranging in the block of electromagnets a circulation of a coolant fluid, for example transformer oil. It will also be noted that, in this apparatus, the anode-cathode potential can be adjusted to a value such that no discharge will take place in the absence of the magnetic field. By adjusting the latter, it will then be possible to trigger the discharge at will and, by so doing, to bring about the sputtering of the substances located in the region subjected to this field or to arrest it at a selected instant. In the present apparatus, it is also possible to employ a high-frequency potential instead of the d.c. potential mentioned; a HF potential makes possible the sputtering of both conducting and insulating materials.

It will also be noted that, in the present apparatus, once one of the faces of the solid electrolyte support has been coated with the layer or layers constituting one of the electrodes, the generation of magnetic fields can be interrupted, the substrate inverted, and the sputtering restarted, the conditions then being adapted for the deposition of the material of the counter-electrode.

A modified form of this apparatus may comprise several substrates mounted on a movable planetary stage and arranged in such a manner that the mean distance between each target and each sample is identical.

It will be noted further that the composition of the deposit may be kept fixed over any given thickness of the deposit or be varied progressively by subjecting the setting of the rheostats to a programmed variation. The number of target regions can, of course, be greater than two, which makes possible the deposition of layers of the most varied composition and the components of which can be modified, during the period of deposition, in a highly diverse but nevertheless reproducible manner. For example, it is possible to alternate insulating layers with layers having conductivity and having different properties.

Thus, the electrodes manufactured according to the present process and which comprise one or more layers of ion and electron-conducting materials, these layers being constituted by solid mixtures of dense metals and/or metal oxides or of fine agglomerated particles are characterised in that (a) the composition of the material of each of said layers, taken individually, is practically uniform and invariable in terms of the surface and over the entire region covered by the electrode, (b) the distribution of the particles of the different substances composing the layers is uniform and conforms to an ordered arrangement, constant or variable in terms of thickness, and the dimensions and properties of the particles of each of said components, taken individually, are homogeneous.

Furthermore, the composition of the material, on passing from one layer to another, can vary without abrupt transition.

Accordingly, the various advantages which may be drawn from the present invention by comparison with the state of the art are as follows:

1. Wide range of possible variations in the composition of the layers.
2. Possibility of depositing several succesive layers of fixed or variable composition without having to open the apparatus.
3. No thermal decomposition of the targets with the attendant risk of fractional distillation of their materials.
4. Ease of control and excellent reproducibility.
5. Manufacturing economies and reliability.
6. The stabilization of the zircina of the targets can be dispensed with.

The following examples describe the preparation of the electrodes and illustrate the invention in a detailed manner.

EXAMPLE 1

A mixture (A) and a mixture (B) were prepared from the following substances ground into fine powders:

A.
  Pure zirconia—22.19 g
  Ytterbium oxide—7.89 g
  Nickel powder—42.72 g
  Titanium powder—1.6 g B.
  Pure zirconia—18.45 g
  Ytterbium oxide—6.56 g
  Uranium oxide—3.19 g
  Cobalt powder—32.1 g These mixtures were uniformly distributed on the surface of a copper plate 3 (see drawing) with (A) in the central region and (B) in the form of a region concentric with the first. To facilitate the holding in position of these mixtures, these regions of the plate were slightly recessed in the copper mass. The plate thus loaded was then subjected to a pressure of 30 tons by means of a plunger press.

The plate was then introduced into a vacuum chamber (for example such as the one illustrated schematically in the drawing) containing a magnetron set 5 with two concentric magnets (see FIG. 1) arranged in such a manner that the magnetic field of one of them acts on the central region of the plate covered with mixture (A) whilst the field of the other acts on the annular region containing the mixture (B).

Following this, there were introduced into the chamber, opposite an anode 2, one or several substrates constituted by wafers of stabilized zirconia in the form of discs having a thickness of approximately 100μ. The chamber was evacuated to a vacuum of $10^{-5}$ Torr and argon was introduced to reach a stabilized pressure of $10^{-3}$ Torr. Following this, a voltage of 620 Volts was established between the copper plate and the anode and the electromagnet of the central region was energized by a current of 3 A. The discharge took place, and the sputtering of the material (A) in the central region was effected and was allowed to continue for 50 minutes. Following this, the central magnet was disconnected and the peripheral magnet was activated and left to act for 30 minutes at 3.4 A.

In this manner, there was obtained on the substrate an anode coating constituted by two layers (A) and (B) as follows:
A. Ytterbium-stabilized zirconia, with finely dispersed Ni and Ti particles mixed therein; thickness: 8μ.
B. Ytterbium-stabilized zirconia, doped with uranium and mixed with Co particles; thickness: 5μ.

These two layers had a very fine structure, the metal particles not being visible under the microscope in the freshly prepared state; they were extremely uniform, homogeneous and of a perfectly controlled composition. After heating to the operating temperature of a fuel cell, there occurred a restructuring of the active material and the metal particles became visible under the microscope (dimensions approximately 0.01 to 0.1μ). This structure was very regular and homogeneous and typical of the active materials prepared according to the process of the invention, and conferred on the fuel cells constructed with such electrodes particularly advantageous properties.

EXAMPLE 2

The procedure was the same as that of Example 1, treating the solid electrolyte wafers and depositing thereon layers (C) and (D) made up of the following mixtures:

|   | Ingredients | Moles % |
|---|---|---|
| C. | $ZrO_2$ | 15 |
|   | $Y_2O_3$ | 1.7 |
|   | Ni (powder) | 83.3 |
| D. | $ZrO_2$ | 20 |
|   | $Yb_2O_3$ | 1.8 |
|   | $UO_2$ | 1.6 |
|   | Cu (powder) | 76.6 |

Working under conditions similar to those described in Example 1, with current 3–3.5 A, voltage approximately 620 v, sputtering time approximately 60 minutes, there was achieved the formation of an anodic coating comprising successively the layers (C) and (D), thickness 0.9–1μ, the compositions of which were identical (within ±10%) with the compositions of the starting mixtures.

EXAMPLE 3

The wafers obtained according to EXAMPLE 2 were used and, after turning them over, there was deposited on their other face, under similar conditions, a cathodic coating consisting of the layers (E) and (F) described in the following.

To achieve this, there was prepared first of all a mixture (E) in the form of a fine powder by grinding together the following compounds:
$ZrO_2$ 0.8 mole—$Yb_2O_3$ 0.1 mole—$Pr_2O_3$ 0.1 mole (15% by volume)
$In_2O_3$ 0.9 mole—$SnO_2$ 0.1 mol (85% by volume)

This was followed by the preparation of a mixture (F) from the following compounds:
$In_2O_3$ 0.9 mole—$SnO_2$ 0.1 mole (50% by volume)
KCl (50% by volume)

The mixture (E) was deposited on the central region of a cathode plate similar to the one described in Example 1, and the mixture (F) in the external annular region. Then after pressing, the plate was subjected to the successive sputtering of the regions (E) and (F), under conditions similar to those described in Example 1, so as to obtain a cathodic coating of which the layers (E) and (F) have approximately the same compositions as the starting powders, but with an extremely fine and regular structure. The thickness of the layers was approximately 3 and 2μ, respectively. By heating to 600° C. for 24 hours, the KCl of the second layer was eliminated, which led to an active material having a porous structure permeable to air. The whole therefore constitutes an anode-solid electrolyte-cathode set.

The wafers thus manufactured were stacked in series to construct a cell operating at 850° C. with, on the one hand, a mixture of 97% H—3% $H_2O$ and, on the other hand, air. This cell supplied a specific power of 0.54 W/cm² at this temperature.

EXAMPLE 4

Two mixtures of fine powders (G) and (H) were prepared from the following ingredients:
G. $ZrO_2$ 0.9 mol—$Y_2O_3$ 0.1 mol (50% by weight)
Platinum powder (50% by weight)
H. Platinum powder The powder (G) was placed on the central region of a cathodic sputtering plate and the platinum powder (H) was placed on the peripheral region. After applying an anode-cathode potential of approximately 600 V, i.e., just inadequate to initiate sputtering in the absence of the magnetic fields, the electromagnet of the central region was energized, the intensity of the magnetic field being adjusted close to the maximum. Then, after a few seconds, a program for varying this magnetic field was initiated (for example by connection with a signal generator controlling the rheostats 7a and 7b). This program was as follows: in the course of a sputtering period of approximately 4–5 hours, the value of the field covering the central region was progressively reduced to zero, while, at the same time, the field acting on the peripheral region was increased to a value close to the maximum.

This programmed sputtering led to a formation of a mixed active layer, the composition of which varied with a gradient of concentration through the thickness of the layer and at the beginning contained 50% Pt and 50% of oxides and, at the end, practically pure Pt. Such a layer can function both as cathode and as anode; further, at the end of the above-described sputtering, the substrate wafers were inverted and the operation was repeated so as to obtain anode-electrolyte-cathode elements which, as in the previous example, can be stacked in series to constitute a fuel cell.

It is to be noted that the percentages by weight indicated above for the powder (G) are in no way compulsory, as other weight proportions can also be used, for example with less platinum, but always provided that in this case the program has to start with a value other than zero with regard to the peripheral region.

EXAMPLE 5

Powder mixtures (I) and (J) were prepared from the following ingredients:

I. $ZrO_2$ 0.8 mol—$Yb_2O_3$ 0.1 mol—$Pr_2O_3$ 0.1 mol (85% by volume)
$In_2O_3$ 0.9 mol—$SnO_2$ 0.1 mol (85% by volume)

J. $In_2O_3$ 0.9 mol—$SnO_2$ 0.1 mol

As in the previous examples, the powder (I) was placed on the central region of the sputtering plate and the powder (J) on the peripheral region, whereafter the whole was subjected to a strong pressure to solidify the powder layers. The cathode plate was then placed in the sputtering chamber, facing solid electrolyte wafers, and a programmed sputtering was carried out in the following manner: As described in the previous example, the deposition was started with a maximum sputtering of the region (I) and a minimum of the region (J) and, in the course of the following ½ hour, this condition was linearly inverted. There was obtained in this manner a first layer of 3μ showing, in the direction of its thickness, a concentration gradient according to which the proportion of the $InO_3 + SnO_2$ passes progressively from 85% to 100%.

After this, the sputtering of the region (J) alone was effected until the total thickness of the active mass was 85μ. This layer constitutes a very efficient generator cathode.

EXAMPLE 6

This example illustrates in a detailed manner the advantages of the invention with regard to the possibility of preparing electrodes composed of superimposed layers of different materials, each of these layers displaying a high degree of uniformity over the whole of its area in spite of the fact that the thickness may be very low. Electrodes of this kind have been prepared to remedy certain defects of a general nature described in the foregoing. It is known that the materials constituting the electrodes in contact with gaseous hydrogen, and especially the materials containing zirconium and a metal powder such as nickel, lack stability and undergo modifications with time. This defect is particularly pronounced when the electrodes operate in electrolyzing mode, in particular for producing $H_2$ and $O_2$ from water. Thus it is found that the Ni particles, originally finely dispersed in the medium, tend, with time, to migrate towards the outside (away from the solid electrolyte) to accumulate in the form of aggregates, the material thus losing its efficiency and conductivity. This tendency is proportional to the thickness of the active layer and to the proportion of the nickel contained in the material (as is in fact the efficiency of the electrode) but with the restriction that it disappears practically completely below 40% Ni. Thus, an electrode comprising a zirconium layer with less than 40% of Ni is not modified appreciably by ageing; however, it is normally of little interest because of its low efficiency due to lack of Ni.

It has now been conceived to remedy the aforementioned drawbacks by constituting an electrode from a series of successive layers of zirconia containing, alternately, low and high proportions of nickel, the layers having a high Ni concentration ensuring the electrochemical performance of the electrode and the layers of low Ni content forming a barrier opposing migration, separation and aggregation of Ni particles. To this end, the following procedure was adopted:

The following compositions were prepared in the form of very finely ground powders:

Composition K:
$ZrO_2$ 0.82 mol—$Yb_2O_3$ 0.1 mol
$UO_2$ 0.08 mol—(35.5% by volume)
Nickel powder—(64.5% by volume)

Composition L:
$ZrO_2$ 0.82 mol—$Yb_2O_3$ 0.1 mol
$UO_2$ 0.08 mol—(80% by volume)
Nickel powder—(20% by volume)

A layer of mixture L was deposited on the central region of a target-support plate similar to the one described in Example 1 and a layer of mixture K was deposited on the peripheral region of this plate. The plate was then pressed and introduced into a sputtering apparatus as described in Example 1. As substrate wafers, discs of zirconia stabilized with ytterbium oxide having a dished shape of the type bearing reference 16a in FIG. 2 were used. These wafers, having a thickness of approximately 300 μm, were placed in the vacuum chamber of the apparatus in such a manner that the frusto-conical portion of the internal face of the dished discs would be subjected to the sputtering field of said apparatus. This was followed by the deposition by sputtering on the wafers of successive layers of the compositions K and L as above under the following conditions:

material K: Pressure $2 \times 10^{-3}$ Torr; sputtering voltage 400 V; discharge current 1 A; external magnetic field 6 A in the electro-magnet; internal magnetic field zero; duration 4 minutes; thickness of deposit 0.5 μm.

Material L: Pressure $3-4 \times 10^{-3}$ Torr; voltage $-300$ to $-350$ V; discharge current 0.45 A; current of the central electro-magnet 6 A; annular magnetic field zero; duration 2 minutes; thickness 0.05 μm.

The process was repeated so as to obtain a deposit made up of 6 K-layers alternating with 5 L-layers, the overall thickness thus being 3.25 μm.

The wafers or the substrate-carrier were then inverted and the deposition of the counter-electrode was carried out on the outer face by sputtering. For the latter, the operation is always carried out in the same manner, by sputtering first a primary layer of 2 μm from a mixture of powders containing 0.8 mol $ZrO_2$, 0.1 mol $Yb_2O_3$ and 0.1 mol $UO_2$, then a main layer of approximately 100 μm (25.5 mg/cm²) of a mixture of $In_2O_3$—$SnO_2$ with 2% by weight of tin oxide.

Figure 2:
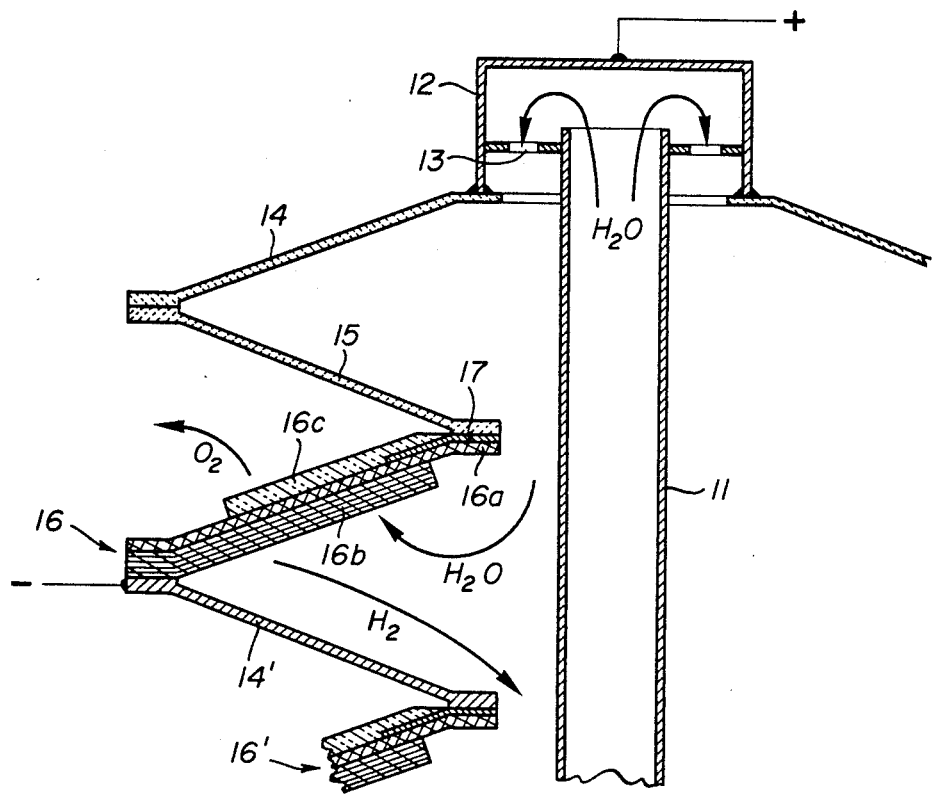
FIG. 2 shows schematically in a partly sectional view a system with two reversible electrodes separated by a solid electrolyte and constituting an element of a generator-electrolysis device.

The electrode wafers manufactured in the manner described above were used to assemble an electrolyzer-generator having the form shown in FIG. 2.

FIG. 2 illustrates a device comprising a tube 11 made of stainless steel capped by a lid 12 fixed to the tube by means of a perforated disc 13. The device comprises, successively, conductor elements 14 and 15 of dished shape, then an anode-cathode element 16, a further conductor element 14', another anode-cathode element 16', and so on. The conductor elements are made of chromium-alumina cermet (50/50). The element 16 is composed of a solid electrolyte 16a, of an electrode 16b, which is in contact with water vapor during electrolysermode operation, and of a counter-electrode 16c the detail of which is given below with reference to FIG. 3. The device also comprises a collector (or supply lead) 17 for the current, made of platinum, for example.

When this device operates in electrolyzer mode, its upper portion is connected to the positive terminal of a current source (schematically indicated by (+) in the drawing), the current being transmitted to part 17 by the conductor elements 14 and 15. The electrode 16b is then connected by way of the conductor element 14, to the negative terminal of the source (schematically indicated by (−) in the drawing); it is of course understood that the electrical connection indicated in the drawing has a purely illustrative function and the purpose of showing that the electrical tests to follow relate to a single element of the electrolyzer; In reality, it is only the terminal conductor element (not shown) which constitutes the cathodic connection link, all the successive active elements 16, 16', 16'', etc... being connected in series in such a manner that the total voltage of the electrolyzer corresponds to the sum of the voltages of each element. The electrolyzer is brought to its operating temperature (approximately 900° C.) and water vapour is introduced through the tube in the direction indicated by arrows in the drawing. This vapour penetrates into the active element 16 where it is decomposed into hydrogen and oxygen which leave as indicated by the symbols and arrows in the drawing. Accordingly, there is collected on one hand a mixture of $H_2O$ and $H_2$ which is formed in the interior of the device and, on the other hand, $O_2$ which evolves on the outside of the latter.

Figures 3, 4:
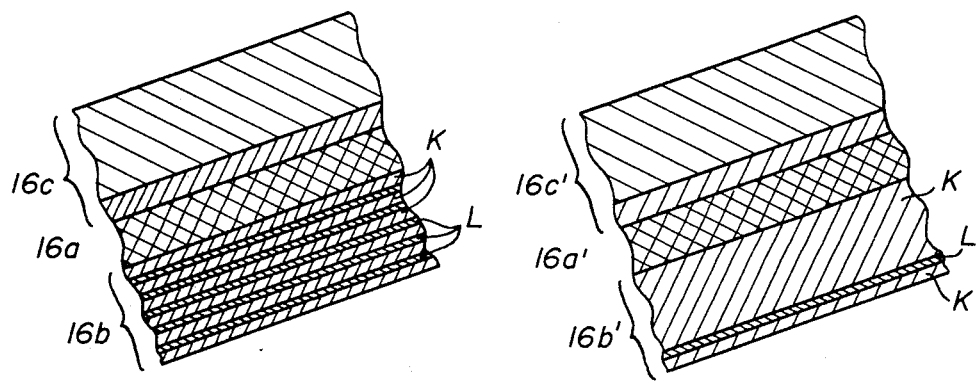
FIG. 3 shows, on a greatly enlarged scale, a detail of an embodiment of the system according to FIG. 2.
FIG. 4 is a similar section which shows another embodiment.

FIG. 3 shows in sectional view on a greatly enlarged scale the detail of the electrode 16 as prepared in the present example. For obvious reasons, the relative thicknesses of the different layers could not be drawn to scale. As shown, the electrode comprises a support 16 of stabilized zirconia on one face of which six layers of material K alternating with five layers of material L have been deposited. On the other face of the support, the counter-electrode 16c can be seen, constituted by the primary layer of zirconia stabilized with $Yb_2O_3$ and doped with $UO_2$, and the principal layer of $In_2O_3$—$SnO_2$.

Figure 7:
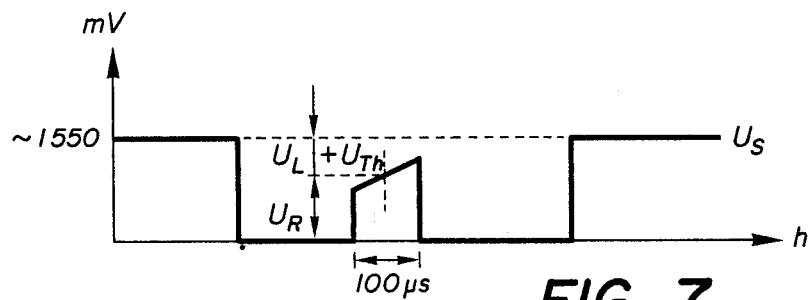
FIG. 7 illustrates schematically the measuring technique which yielded the results of the graphs in FIGS. 5 and 6.

The current density ($I/dm^2$) was kept constant in time, and parameters of the voltage required to maintain, during the service life of the electrode, this current density of the electrolyzer were recorded. These parameters include the operating voltage $U_S$ which is composed of the theoretical voltage $U_{Th}$ and the variables $U_L$ and $U_R$ defined below. For determination of these, the electrolysis current was interrupted every 10 hours and, after a pause of 5 seconds, a pulse of 100 µsec was transmitted, the shape of which is shown in FIG. 7, while the mean voltage $U_R$ of this pulse and the difference $U_L+U_{Th}$ between the permanent operating voltage $U_S$ (corresponding to the constant current density described above) and the measured value $U_R$ were recorded.

Figure 5:
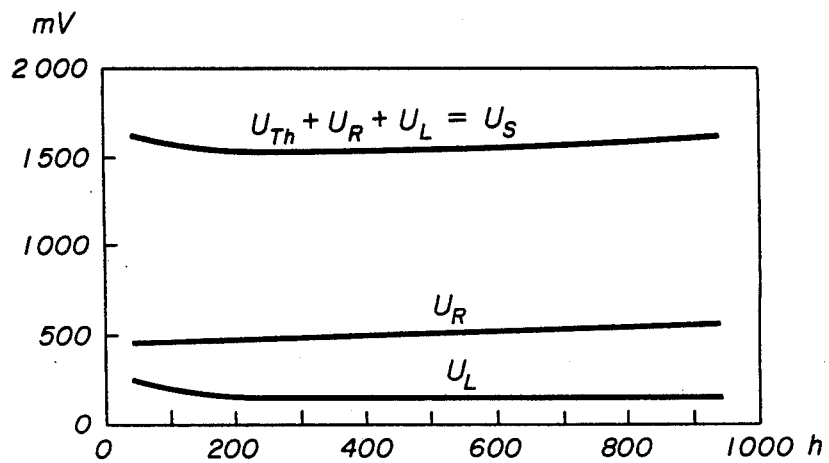
FIG. 5 illustrates by means of graphs the variation of voltage with the time necessary for maintaining a constant current through the anode-cathode system of FIG. 3.

FIG. 5 shows, for a single element, the variation of these values during more than 900 hours of operation. It shows that the present anode-cathode system is remarkably stable with regard to time, as the value of $U_R$ displays only an extremely slight increase by reason of the very low rate of diffusion and agglomeration of nickel particles of the ceramic of the positive electrode.

By way of comparison, an electrode system identical to the one just described was manufactured by the same sputtering method, but with the difference that the hydrogen electrode is not constituted by a series of eleven layers alternately rich and poor in nickel, but only of 3 layers as follows: successively, 3µ of material K, 0.05µ of material L and 0.05µ of material K. This electrode is shown in FIG. 4 by reference 16b', the reference numerals 16a' and 16c' representing, respectively, the support and the counter-electrode which are identical to the corresponding elements in FIG. 3.

Figure 6:
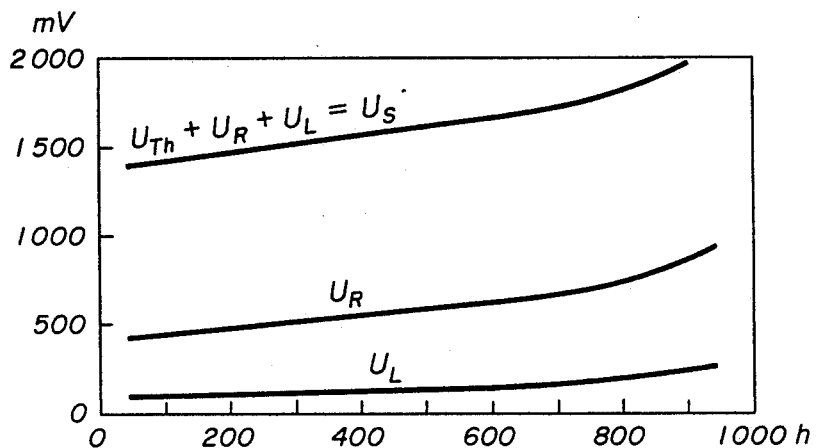
FIG. 6 gives similar data with respect to the embodiment according to FIG. 4.

FIG. 6 shows, by way of comparison, the results recorded with this electrode under the same conditions as those described with reference to FIG. 5. It is seen that the stability of the operating parameters, although greatly superior to those of the electrodes manufactured by conventional means, is far from being equal to that of the electrode having 11 layers previously described. This lack of stability is due to a progressive loss of conductivity due to the agglomeration of the Ni of the ceramic. Owing to this loss, the electronic control device of the assembly must continuously increase the voltage in order to keep constant the current density fixed at the outset for permanent operation. Such an increase therefore represents a loss in output and an increase in energy losses due to the internal resistance.

The device illustrated in FIG. 2 also operates in generator mode when it is fed, at 800°–900° C., with a stream of hydrogen. Under these conditions it supplies 480 mW/cm² with a stability exceeding 1000 hours.

We claim:

1. An electrode for removable fuel cells comprising: a solid electrolyte substrate and
deposited on said solid electrolyte substrate, at least one layer of electrically conducting material having a total thickness ranging from 0.01µ to 85µ, said layer composed of a solid mixture of metals, metal oxides, or mixtures thereof in compressed form or in the form of agglomerated, fine particles:
wherein said layer of electrically conducting material is uniform and invariable over the entire surface area of said solid electrolyte substrate;
wherein the thickness of said layer of electrically conducting material may vary while the dimensions and properties of the particles of the components of said layer of electrically conducting material, taken individually, are homogeneous; and
wherein said layer of electrically conducting material is applied to said solid electrolyte substrate by cathode sputtering.

2. The electrode defined in claim 1 wherein the composition of the layer of electrically conducting material, on passing from one layer to another, varies without abrupt transition.

3. The electrode defined in claim 1 wherein the thickness of at least one of the layers of electrically conducting material varies, said variation assuming the form of a concentration gradient of at least one of the components constituting said layer relative to the other components thereof.

4. The electrode according to claim 1 wherein the layer of electrically conducting material is constituted by a succession of very thin layers, these layers being alternatively rich and poor in metal powder, the poor layer opposing the migration, during operation, of metal particles and the formation of aggregates of same.

5. The electrode according to claim 4 wherein the layers of electrically conducting material contain stabilized zirconia and nickel powder, the rich layer containing more than 40% Ni by volume and the poor layer less than 40% by volume.

6. The electrode according to claim 5 wherein the rich layer has a thickness of 0.1 to 1$\mu$ and the poor layer has a thickness of 0.01 to 0.1$\mu$.

7. The electrode according to claim 6 wherein the zirconia is stabilized with $Yb_2O_3$ and doped with $UO_2$ so that the rich layer contains 60 to 80% Ni by volume and the poor layer contains 5 to 30% Ni.

* * * * *